(12) United States Patent
Achehboune et al.

(10) Patent No.: US 11,736,866 B2
(45) Date of Patent: Aug. 22, 2023

(54) SEMICONDUCTOR STRUCTURES

(71) Applicant: Cirrus Logic International Semiconductor Ltd., Edinburgh (GB)

(72) Inventors: Rkia Achehboune, Edinburgh (GB); Roberto Brioschi, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 17/520,386

(22) Filed: Nov. 5, 2021

(65) Prior Publication Data

US 2022/0060835 A1 Feb. 24, 2022

Related U.S. Application Data

(63) Continuation of application No. 16/822,771, filed on Mar. 18, 2020, now Pat. No. 11,223,907.

(Continued)

(30) Foreign Application Priority Data

Apr. 29, 2019 (GB) ..................................... 1905921
Apr. 29, 2019 (GB) ..................................... 1905922
Apr. 29, 2019 (GB) ..................................... 1905923

(51) Int. Cl.
*H04R 19/04* (2006.01)
*B81B 7/00* (2006.01)

(52) U.S. Cl.
CPC ........... *H04R 19/04* (2013.01); *B81B 7/0058* (2013.01); *B81B 7/0061* (2013.01);
(Continued)

(58) Field of Classification Search
CPC .. H04R 19/04; H04R 2201/003; H04R 31/00; H04R 1/04; H04R 19/005; B81B 7/0058; B81B 7/0061; B81B 7/0064; B81B 2201/0257; B81B 2203/0127; B81B 2203/0315; B81B 2207/012;
(Continued)

(56) References Cited

U.S. PATENT DOCUMENTS

2010/0047567 A1 2/2010 Souriau
2010/0195299 A1 8/2010 Souriau et al.
(Continued)

FOREIGN PATENT DOCUMENTS

EP 0478426 A1 4/1992
EP 3239096 A2 11/2017
(Continued)

OTHER PUBLICATIONS

Examination Report under Section 18(3), UKIPO, Application No. GB1905922.9, dated Dec. 30, 2021.
(Continued)

*Primary Examiner* — Sunita Joshi
(74) *Attorney, Agent, or Firm* — Jackson Walker L.L.P

(57) ABSTRACT

The present application relates to structures for supporting mechanical, electrical and/or electromechanical components, devices and/or systems and to methods of fabricating such structures. The application describes a primary die comprising an aperture extending through the die. The aperture is suitable for receiving a secondary die. A secondary die may be provided within the aperture of the primary die.

27 Claims, 13 Drawing Sheets

Related U.S. Application Data

(60) Provisional application No. 62/822,268, filed on Mar. 22, 2019.

(52) U.S. Cl.
CPC .... B81B 7/0064 (2013.01); *B81B 2201/0257* (2013.01); *B81B 2203/0127* (2013.01); *B81B 2203/0315* (2013.01); *B81B 2207/012* (2013.01); *H04R 2201/003* (2013.01)

(58) Field of Classification Search
CPC .......... B81C 2203/032; B81C 1/00253; B81C 2203/0792; B81C 1/0023; H01L 24/95; H01L 25/04
See application file for complete search history.

(56) References Cited

U.S. PATENT DOCUMENTS

| | | | |
|---|---|---|---|
| 2014/0264647 | A1 | 9/2014 | Katragadda et al. |
| 2017/0313579 | A1 | 11/2017 | Ghidoni et al. |
| 2018/0146302 | A1 | 5/2018 | Chen et al. |
| 2018/0233469 | A1 | 8/2018 | Palm et al. |
| 2018/0295458 | A1* | 10/2018 | Steiert ................. B81C 1/00238 |

FOREIGN PATENT DOCUMENTS

| | | |
|---|---|---|
| GB | 2202673 A | 9/1988 |
| GB | 2549644 A | 10/2017 |

OTHER PUBLICATIONS

Examination Report under Section 18(3), UKIPO, Application No. GB1905921.1, dated Jan. 5, 2022.
Examination Report under Section 18(3), UKIPO, Application No. GB1905923.7, dated Jan. 5, 2022.
Examination Report under Section 18(3), UKIPO, Application No. GB1905922.9, dated Oct. 6, 2022.
Examination Report under Section 18(3), UKIPO, Application No. GB1905921.1, dated Oct. 6, 2022.
Examination Report under Section 18(3), UKIPO, Application No. GB1905923.7, dated Oct. 6, 2022.
Examination Report under Section 18(3), UKIPO, Application No. GB1905923.7, dated Dec. 15, 2022.
Combined Search and Examination Report under Sections 17 and 18(3), UKIPO, Application No. GB1905921.1, dated Sep. 13, 2019.
Combined Search and Examination Report under Sections 17 and 18(3), UKIPO, Application No. GB1905922.9, dated Sep. 13, 2019.
Combined Search and Examination Report under Sections 17 and 18(3), UKIPO, Application No. GB1905923.7, dated Sep. 13, 2019.
Examination Report under Section 18(3), UKIPO, Application No. GB1905921.1, dated May 25, 2021.
Examination Report under Section 18(3), UKIPO, Application No. GB1905922.9, dated May 25, 2021.
Examination Report under Section 18(3), UKIPO, Application No. GB1905923.7, dated May 25, 2021.
International Search Report and Written Opinion of the International Searching Authority, International Application No. PCT/GB2020/050736, dated Jun. 26, 2020.
Combined Search and Examination Report under Sections 17 and 18(3), UKIPO, Application No. GB1905921.1, dated Oct. 12, 2020.
Combined Search and Examination Report under Sections 17 and 18(3), UKIPO, Application No. GB1905922.9, dated Oct. 5, 2020.
Combined Search and Examination Report under Sections 17 and 18(3), UKIPO, Application No. GB1905923.7, dated Oct. 12, 2020.
Examination Report under Section 18(3), UKIPO, Application No. GB1905922.9, dated Jun. 1, 2023.
Examination Report under Section 18(3), UKIPO, Application No. GB1905921.1, dated Jun. 1, 2023.
Examination Report under Section 18(3), UKIPO, Application No. GB1905923.7, mailed Jun. 1, 2023.

* cited by examiner

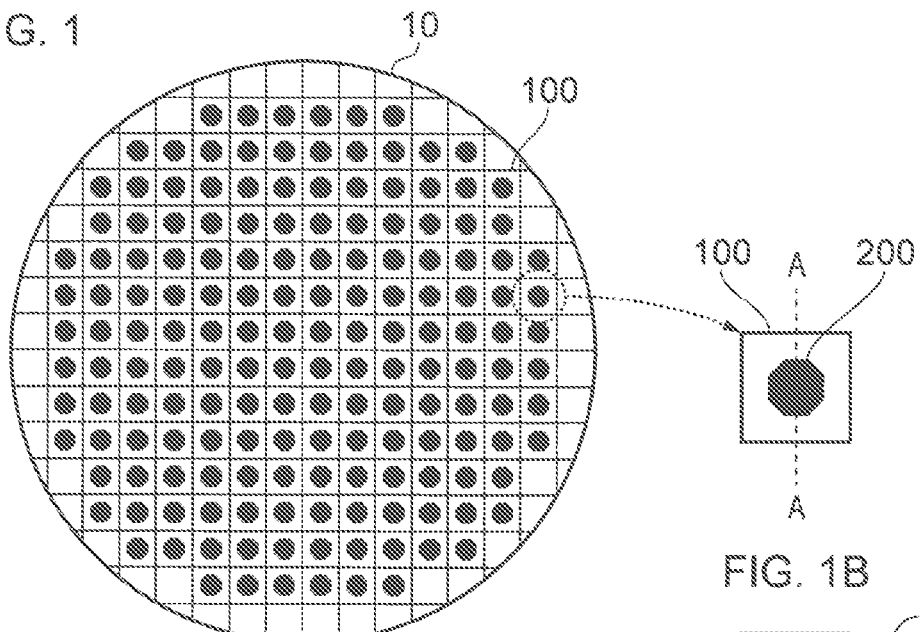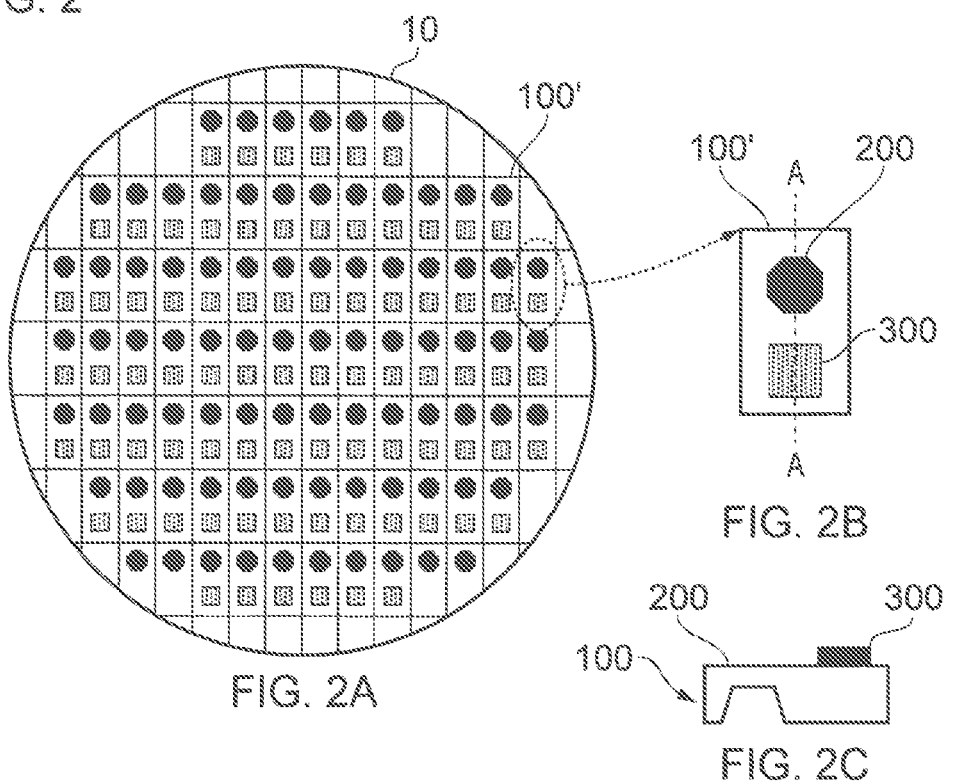

FIG. 5
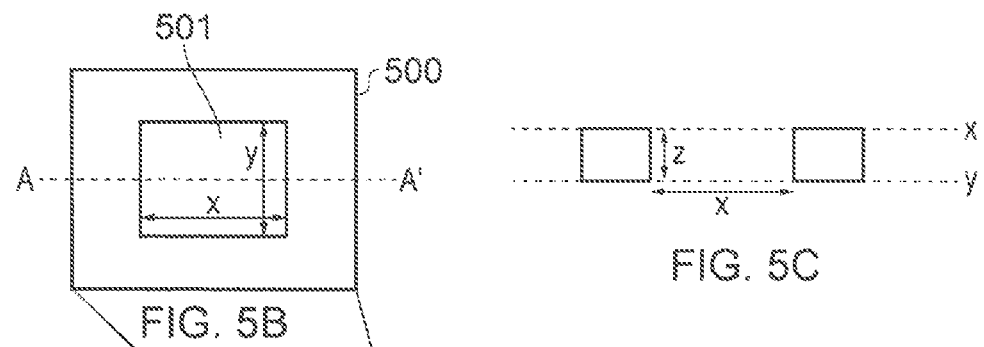
FIG. 5B
FIG. 5C
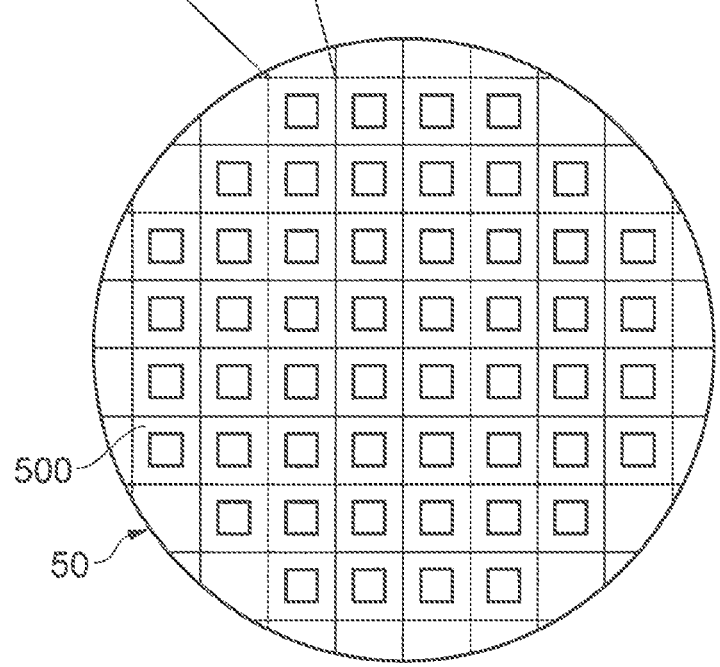
FIG. 5A

FIG. 6
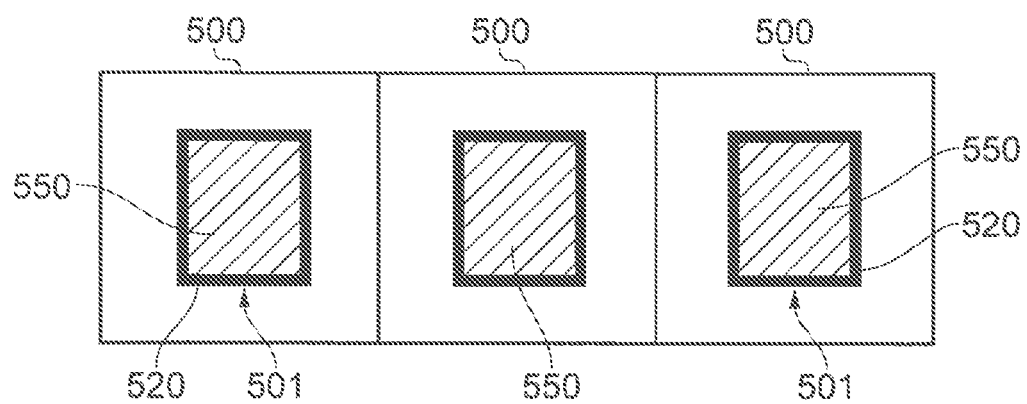
FIG. 6A
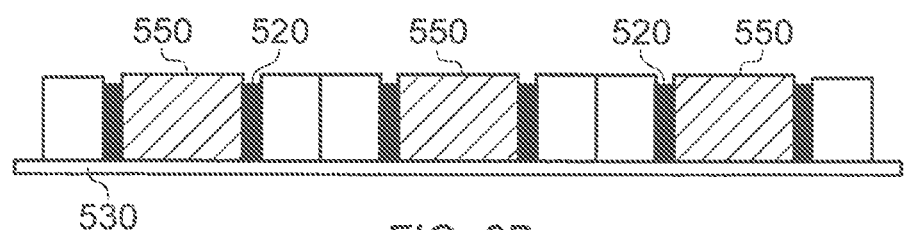
FIG. 6B
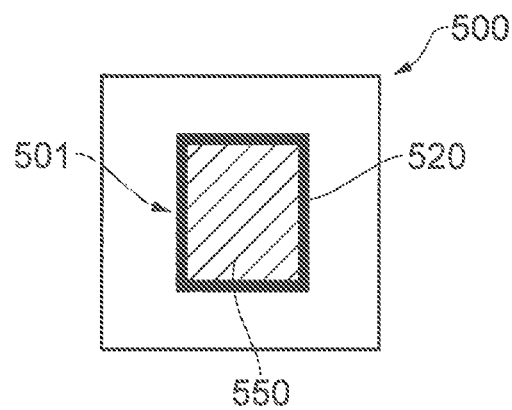
FIG. 6C

FIG. 7
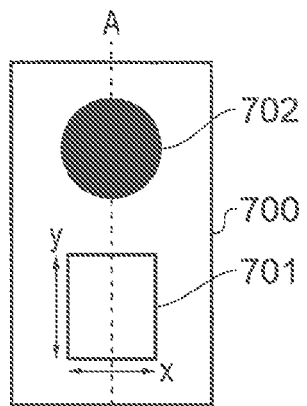
FIG. 7B
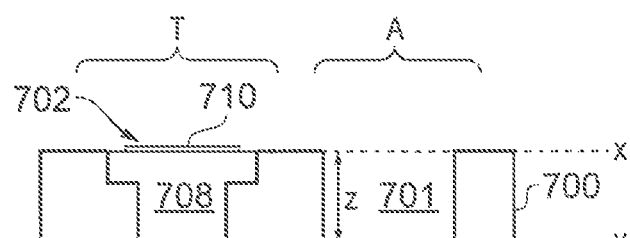
FIG. 7C
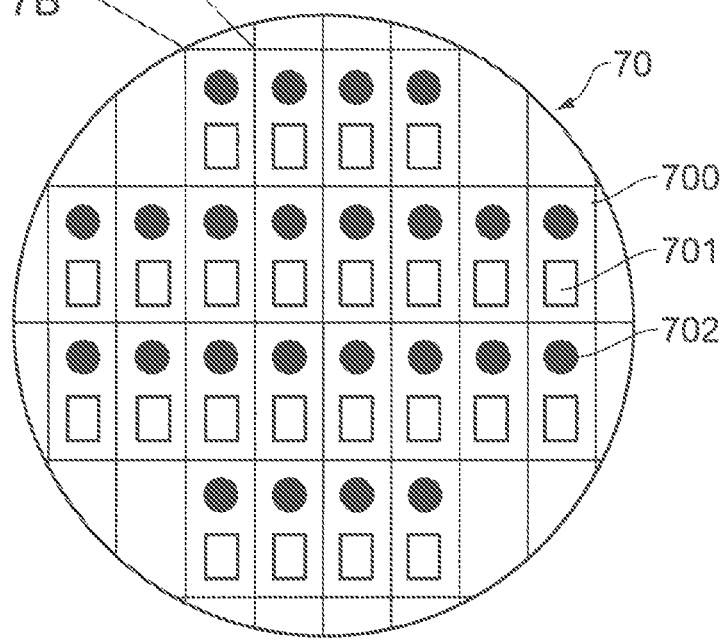
FIG. 7A
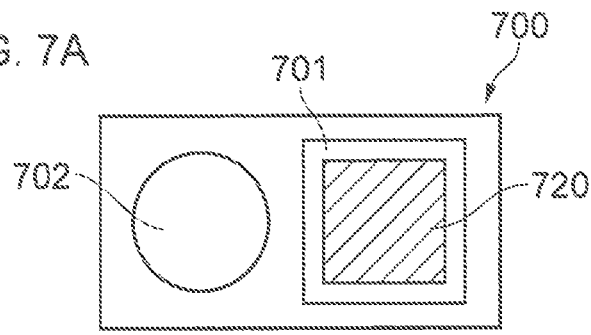
FIG. 7D FIG. 8
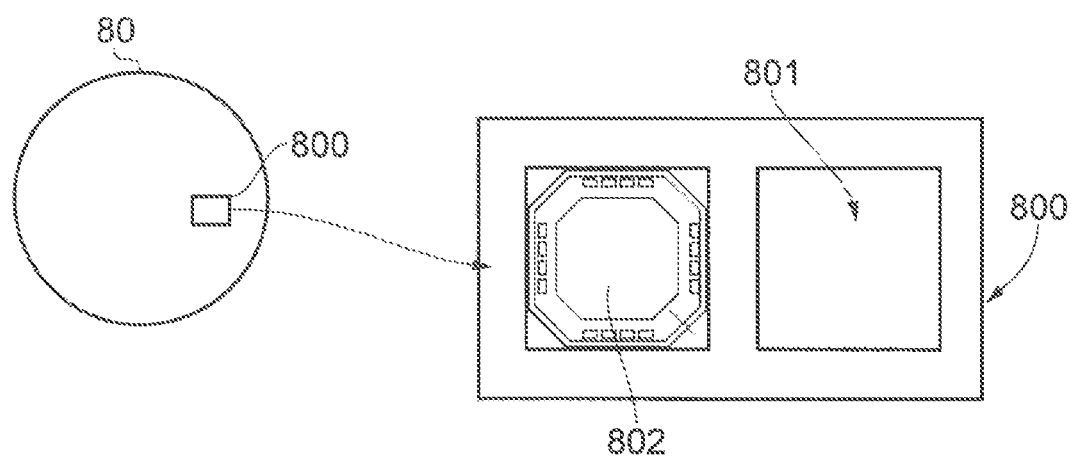
FIG. 8A
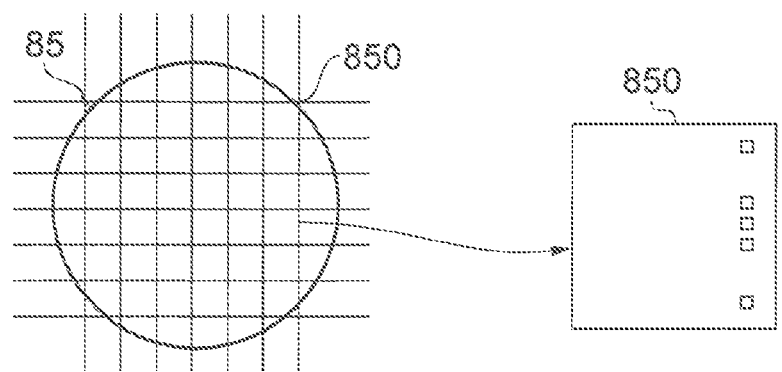
FIG. 8B FIG. 10
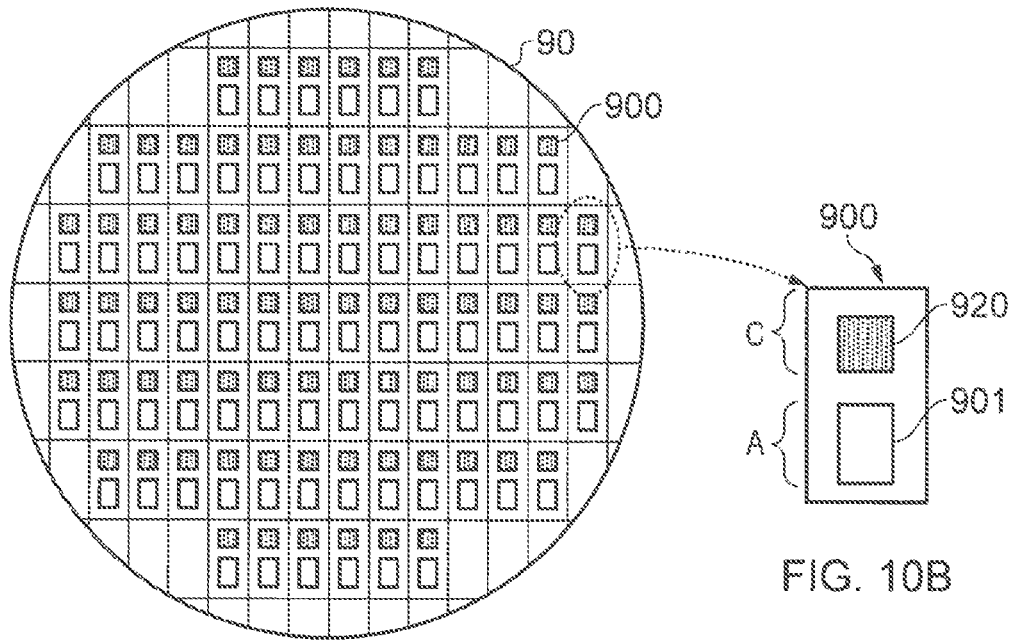
FIG. 10A
FIG. 10B
FIG. 11
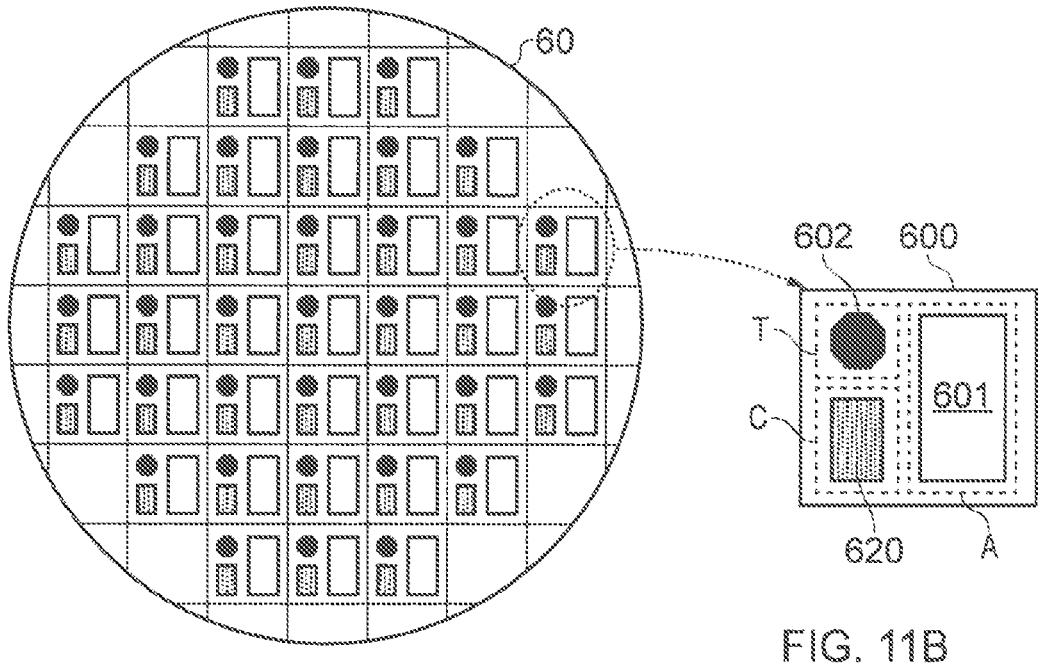
FIG. 11A
FIG. 11B FIG. 12
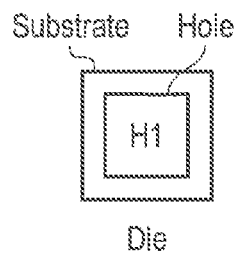
FIG. 12A
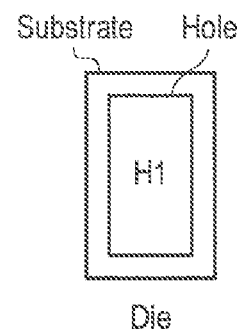
FIG. 12B
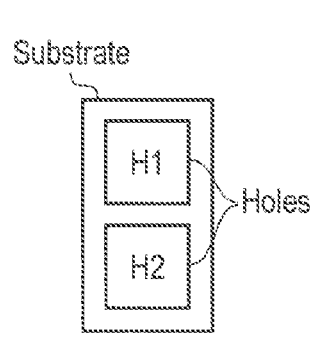
FIG. 12C
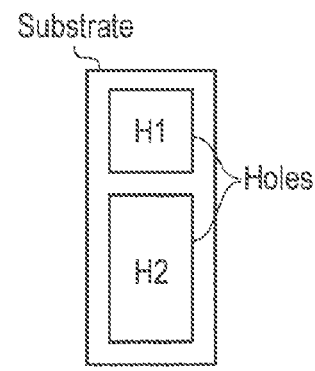
FIG. 12D
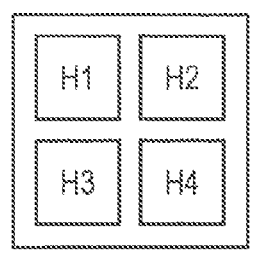
FIG. 12E
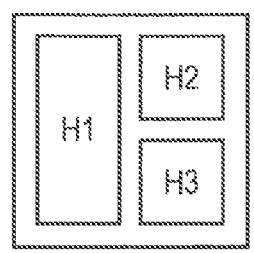
FIG. 12F

SEMICONDUCTOR STRUCTURES

The present disclosure is a continuation of U.S. Non-Provisional patent application Ser. No. 16/822771, filed Mar. 18, 2020, which claims priority to U.S. Provisional Patent Application No. 62/822268, filed Mar. 22, 2019, United Kingdom Patent Application No. GB1905923.7, filed Apr. 29, 2019, United Kingdom Patent Application No. GB1905922.9, filed Apr. 29, 2019, and United Kingdom Patent Application No. GB1905921.1, filed Apr. 29, 2019, each of which is incorporated by reference herein in its entirety.

The present application relates to structures for supporting mechanical, electrical and/or electromechanical components, devices and/or systems and to methods of fabricating such structures. In particular, the present application relates to structures for supporting miniaturised transducers and/or integrated circuits and to techniques for fabricating and packaging such structures.

Many miniaturised components, devices or systems incorporate semiconductor material such as silicon, germanium and gallium arsenide for example. Typically, a plurality of semiconductor components and/or devices and/or systems are manufactured at the same time by wafer processing techniques. Thus, a wafer of semiconductor material undergoes a plurality of processing steps in order to fabricate a plurality of individual devices or circuits on the wafer. The wafer is subsequently diced thus creating a plurality of individual die.

Thus, a discrete die or "chip" may comprise a component, such as a transducer component having a particular function. Additionally or alternatively a discrete die may comprise at least one electronic circuit component.

Semiconductor die fabrication and packaging techniques are evolving rapidly, driven by a desire to streamline the manufacture, testing and packaging of electronic components. It will be appreciated that the processing of multiple semiconductor components in a single operation—often referred to as "batch processing"—is highly advantageous. Batch processing (which may comprise single-wafer processing or the processing of multiple wafers) may include wafer level processing techniques batch processing is cost-effective and produces consistent and repeatable results.

The present aspects and examples relate to structures for supporting miniaturised components, devices or systems. In particular, but not exclusively, the present aspects relate to structures for supporting miniaturised components, devices and/or systems which incorporate semiconductor material, for example MEMS transducer die and/or integrated circuits (ICs). In particular, the present aspects seek to provide support structures which are particularly suitable for wafer and/or batch-level processing techniques. The present aspects also relate to package designs and to wafer-level packaging techniques.

According to an example of a first aspect there is provided a semiconductor wafer comprising a plurality of primary die, at least one primary die comprising an aperture extending through the semiconductor wafer from an upper surface of the semiconductor wafer to a lower surface of the semiconductor wafer, wherein the aperture is suitable for receiving a secondary die.

In the present disclosure the term "aperture" may be used interchangeably with the term "hole". An aperture or hole formed in the semiconductor wafer is, in the context of this disclosure, considered to be a region completely absent of any of the material forming the semiconductor wafer. The aperture extends, unimpeded, all the way through the plane of the semiconductor wafer and connects a region directly above the surface of wafer portion to a region directly below the surface of the wafer portion. An aperture may be considered to be an intra-planar region of absence, formed within the plane of the wafer.

According to the present aspects, the aperture is suitable for receiving a secondary die. The secondary die that is intended to be located within the aperture according to one or more of the present examples will have a given or predefined length (x) and width (y). According to at least one example the aperture of a given wafer portion of the semiconductor wafer exhibits a length and a width that is greater than or equal to the length and width of the secondary die.

According to at least one example a secondary die is provided within one said aperture of a given primary die portion of the wafer. The secondary die can be considered to comprise a structure which supports or defines one or more components—including electrical and/or mechanical components. The secondary die has a length and a width. Preferably the aperture of a given wafer portion of the semiconductor wafer exhibits a length and a width that is greater than the length and width of the secondary die.

The secondary die may comprise a transducer die and/or a circuitry die (e.g. an IC). The cross-sectional area of the, or each, secondary die may be smaller than the cross-sectional area of the respective aperture within which the secondary die is provided. According to at least one example a secondary die may be supported within an aperture of a given primary die by means of a moulding, adhesive or bonding type material. The moulding material may be provided between the outer perimeter of the secondary die and the side walls of the respective aperture. The adhesive material may comprise e.g. a polymer or epoxy type material and is preferably a hardenable or settable material which may be applied in liquid form and which, when hardened, serves to secure the secondary die within the aperture by providing a bonding material between the secondary die and the side walls of the aperture.

The secondary die can be considered to have been fabricated according to a particular technology process and/or technology node which may be the same or different to the technology process/node of the semiconductor wafer which forms a respective primary substrate.

The secondary die, which will typically comprise semiconductor material, can be considered to be generally planar in form. The planar dimensions of the secondary die are thus defined by the length and width of the secondary die. Thus, according to at least one example, when the secondary die is oriented such that the plane of the secondary die is substantially aligned with, or substantially parallel to, the plane of the respective semiconductor primary die, wherein the aperture is shaped and sufficiently sized to accommodate the planar dimensions of the secondary die.

An example of a secondary die is a semiconductor die. In the context of the present disclosure a "die" or "chip" shall be understood to mean an individual block of semiconducting material. Typically, a die will have been generated following the dicing, i.e. singulation, of a wafer. A die may define or support one or more components. For example, a die may comprise an integrated circuit die, the integrated circuit die comprising one or more circuitry components to provide a functional circuit. A die may additionally or alternatively comprise a transducer, or sensor, such as a MEMS transducer.

According to at least one example of the first aspect the at least one primary die further comprises:

a MEMS transducer provided in a transducer region of the die, wherein the semiconductor wafer material of the primary die forms a substrate of the MEMS transducer.

The MEMS transducer may be, e.g. a MEMS microphone transducer. A MEMS microphone transducer typically comprises a flexible membrane which overlies a cavity. According to the present aspects the cavity of a MEMS transducer of a given primary die may be formed in the lower surface of the primary die at the same time as the, or at least one of the, aperture(s) of the primary die. Thus, the MEMS microphone transducer can be considered to be formed by a process which involves processing the semiconductor material of the transducer region of the primary die.

According to at least one example of the first aspect each of the primary die further comprises:

a circuitry region, the circuitry region comprising at least one circuitry component in the circuitry region.

Thus, the at least one circuitry component can be considered to be formed by a process which involves processing the semiconductor material of the circuitry region of the primary die to define at least one circuitry component. The circuitry region may be processed to define at least one electronic circuit.

According to at least one example of a second aspect there is provided a semiconductor wafer comprising a plurality of primary die, at least one primary die comprising:
a MEMS transducer provided in a transducer region of the primary die; and
an aperture provided in an aperture region of the primary die, wherein the aperture extends through the primary die from an upper surface of the primary die to a lower surface of the semiconductor wafer, wherein each aperture is suitable for receiving a secondary die.

According to at least one example of a third aspect there is provided a semiconductor wafer comprising a plurality of wafer portions, at least some of the wafer portions defining a primary die and comprising:
a circuitry region comprising at least one circuitry component; and
at least one aperture extending through the semiconductor wafer from an upper surface of the semiconductor wafer to a lower surface of the semiconductor wafer, wherein the aperture is suitable for receiving a secondary die.

According to at least one example of a fourth aspect there is provided a semiconductor wafer comprising a plurality of wafer portions, at least some of the wafer portions comprising:
  a MEMS transducer formed in a transducer region of the wafer portion;
  a region of absence, the region of absence being a region where the material of the semiconductor wafer has been removed, the region of absence extending between a first plane defined by the upper surface of the wafer and a second plane defined by the lower surface of the wafer portion.

According to at least one example of a fifth aspect there is provided an apparatus comprising:
i) a semiconductor wafer comprising a plurality of wafer portions, each wafer portion defining a primary substrate and comprising at least one aperture extending through the semiconductor wafer from an upper surface of the semiconductor wafer to a lower surface of the semiconductor wafer;
ii) a secondary substrate, the secondary substrate having a length and a width;
   wherein the aperture of a given wafer portion of the semiconductor wafer exhibits a length and a width that is greater than or equal to the length and width of the secondary substrate.

Substrates which support or comprise miniaturised (e.g. MEMS) transducers and/or ICs are typically housed within a package which allows easy handling and assembly and serves to protect the device from e.g. mechanical damage, RF noise and environmental contamination. The package also provides a means for connecting the package to a circuit board or other elements. The creation of a package for an electronic system involves numerous processing steps and stages. In conventional packaging techniques, the finished wafer is diced into individual chips which are then bonded and electrically connected to a packaging substrate, such as a PCB substrate for example, and then encapsulated. Wafer-level packaging involves packaging the wafer comprising the die, i.e. die wafer, with another suitable processed capping wafer, i.e. cap wafer, whilst the die are still part of the die wafer and prior to dicing into bonded die and cap wafers into individual packaged components.

According to at least one example of a sixth aspect there is provided a semiconductor wafer according to an example of any of the present aspects and further comprising at least one lid or cap structure, the lid structure being provided for the at least one primary die.

Thus, each lid structure may comprise a metal, e.g. tin, lid which is supported on the upper surface of a respective primary die. According to a further example, each lid structure may comprises a PCB (printed circuit board) which is provided in a plane overlying the plane of the respective primary die. In this case, each primary die may be provided with a spacer structure which is mounted on the upper surface of the primary die and serves to space and support the PCB lid structure relative to the primary die.

It will be appreciated that it is advantageous to be able to provide a package or lid structure relative to the plurality primary dies as part of a wafer level packaging process. Thus according to at least one example of a seventh aspect there is provided a wafer package comprising first and second wafers, the first wafer comprising a semiconductor wafer according to an example of the present aspects and the second wafer comprising a cap wafer, the cap wafer defining a plurality of cap structures, each cap structure being provided for a corresponding wafer portion of the semiconductor wafer.

According to at least one example of an eighth aspect there is provided a primary die formed by dicing the semiconductor wafer according to an example of the first through sixth aspects.

According to at least one example of a ninth aspect there is provided a MEMS transducer comprising:
a substrate, the substrate having a cavity formed therein;
a membrane which overlies the cavity;
wherein the substrate comprises a lateral extension portion and wherein an aperture is formed in the lateral extension portion, the aperture extending through the substrate from an upper surface of the substrate to a lower surface of the substrate.

According to at least one example a secondary die is fixedly provided within one or more aperture formed through the primary die portion.

Thus, the present aspects encompass semiconductor structures which in addition to at least one aperture, comprise blank or unprocessed semiconductor material or which comprise at least one region of processed semiconductor material. For example, a given region of semiconductor material may be processed to provide electronic circuitry. Alternatively, or additionally, a given region of semiconductor material may be processed to provide a transducer, such as a MEMS microphone transducer. For a better understanding of the present invention and to show how the same may be carried into effect, reference will now be made by way of example to the accompanying drawings, in which:

FIGS. 1A-1C, which may be collectively referred to as FIG. 1, illustrate a semiconductor wafer and respective singulated die;

FIGS. 2A-2C, which may be collectively referred to as FIG. 2, illustrate a semiconductor wafer and respective singulated die;

Figure 16:
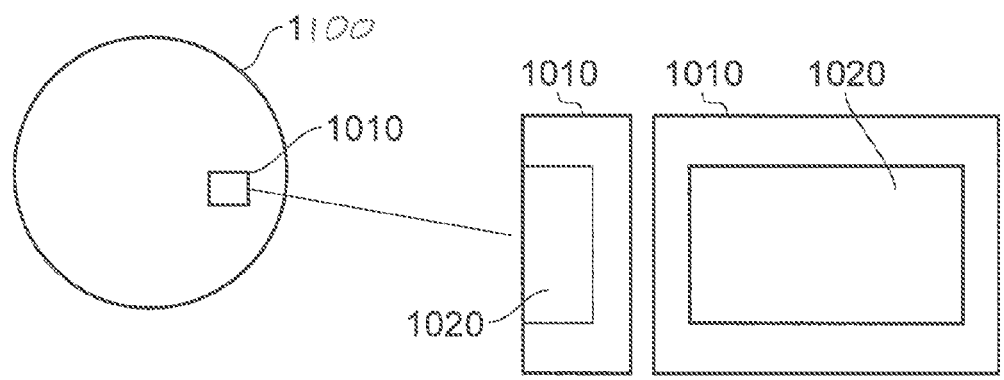

FIGS. 5A-5C, which may be collectively referred to as FIG. 5, illustrate a semiconductor wafer and primary die according to a first example;

FIGS. 6A-6C, which may be collectively referred to as FIG. 6, illustrate a semiconductor wafer and primary die according to a second example;

FIGS. 7A-7D, which may be collectively referred to as FIG. 7, illustrate various views of a semiconductor wafer, and corresponding primary die according to a further example;

FIGS. 8A and 8B, which may be collectively referred to as FIG. 8, and FIGS. 9A-9D, which may be collectively referred to as FIG. 9, illustrate a process of fabricating a support structure similar to that shown in FIG. 7D;

FIGS. 10A and 10B, which may be collectively referred to as FIG. 10, illustrate a semiconductor wafer, and corresponding primary die, according to a further example;

FIGS. 11A and 11B, which may be collectively referred to as FIG. 11, illustrate a semiconductor wafer, and corresponding substrate die, according to a further example;

FIGS. 12A-12F, which may be collectively referred to as FIG. 12, and FIGS. 13, 14 and 15, show various different structures according to further examples;

FIG. 16 shows a cap wafer according to one example; and

Figure 17:
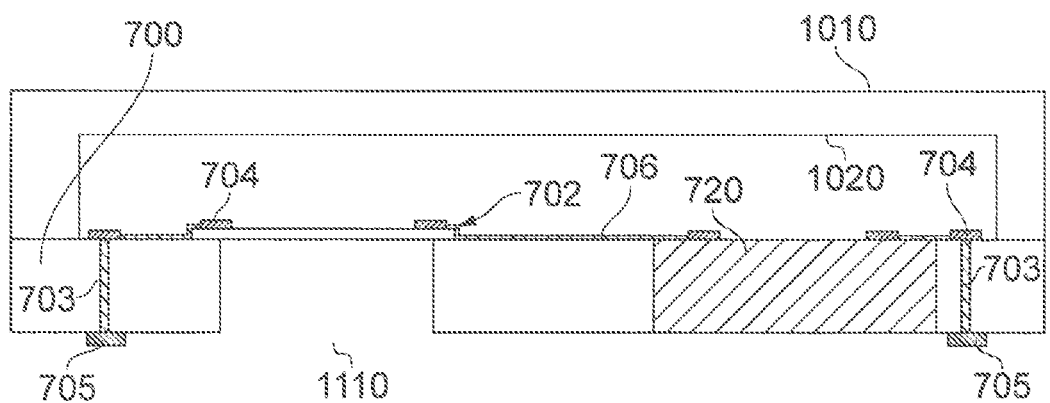

FIG. 17 shows a transducer package comprising a primary die which is similar to the primary die illustrated in FIG. 7D.

DESCRIPTION

Throughout this description any features which are the same or similar to features in other figures have been given the same reference numerals.

The present examples relate generally to support structures for supporting electronic and/or electromechanical components and/or systems. Such support structures are typically fabricated from a wafer of semiconductor material.

FIG. 1 illustrates a semiconductor wafer and respective singulated die. Specifically, FIG. 1A schematically illustrates a semiconductor wafer 10 comprising a plurality of wafer portions 100. Each wafer portion 100 defines a die and is processed to form a transducer 200 such as a MEMS capacitive transducer. FIG. 1B illustrates a single, or discrete, transducer die 100 formed following dicing of the wafer and comprising the transducer 200. FIG. 1C provides an illustrative cross-sectional view through the line A-A of the discrete, or monolithic, die 100 illustrated in FIG. 1B.

FIG. 2 illustrates a semiconductor wafer and respective singulated die. Specifically FIG. 2A schematically illustrates a semiconductor wafer 10 comprising a plurality of wafer portions 100'. In this example each wafer portion 100' defines a die which comprises a transducer component 200 and electronic circuit component. The electronic circuitry may be provided for the operation of, and/or with, the transducer 200 and will be electrically and operatively coupled to the transducer. FIG. 2B illustrates a single die 100 comprising the transducer 200 and the circuitry 300 that are both integrated on the same substrate. As illustrated in FIG. 2C which provides an illustrative cross-sectional view through the line A-A of the die illustrated in FIG. 2B, the circuit portion 300 is typically fabricated at the upper surface of the die 100 extending into the upper surface of the die.

Semiconductor components including MEMS devices and/or electronic circuitry are typically housed within a package which allows easy handling and assembly and serves to protect the device from e.g. mechanical damage, RF noise and environmental contamination. The package also provides a means for electrically and mechanically connecting the package to a circuit board or other elements.

Various previously proposed packaging configurations are known. For example, a package for a MEMS transducer typically comprises a package substrate, which may be formed of a printed circuit board (PCB), and a cover portion which extends in a plane overlying the upper surface of the package substrate supported by side walls. The cover portion and side walls may be provided by a metallic lid which is attached to the upper surface of the package substrate. Alternatively, the cover portion and the side walls may be formed of two further PCBs. The three PCBs are bonded together wherein the middle PCB comprises an opening which defines the chamber of the package. One or more die are mounded to the upper surface of the package substrate within the chamber for example a MEMS transducer die and a circuitry die (IC).

The fabrication of a package for an electronic system involves numerous stages. The manufacturing steps involved in creating packaged chips are collectively known as "packaging".

Figure 3:
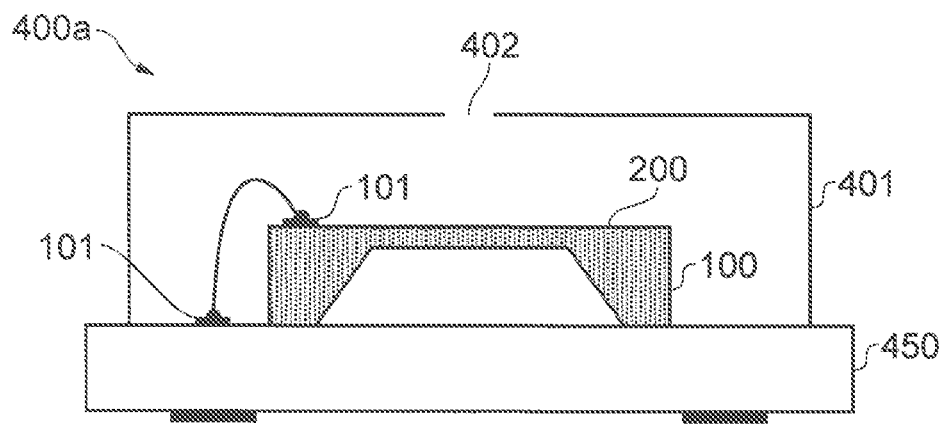
FIG. 3 illustrates a MEMS microphone package.

FIG. 3 illustrates a previously proposed MEMS microphone package 400a comprising a package substrate 450 and a cover 401. A semiconductor substrate 100 comprising a MEMS transducer 200 is housed inside the package. The cover 401 is located over the transducer chip 100 and is attached to a first surface of the package substrate. The cover 401 may be a metallic lid. The transducer 200 may be a MEMS microphone and an aperture 402 in the cover 401 provides a sound port in order to allow acoustic signals to enter the package and stimulate the transducer. In this example the transducer 200 is electrically coupled to the package substrate 450 via bond pads on the transducer and the upper surface of the package substrate and bond wires.

In an alternative arrangement (not shown) the package may house a chip 100' comprising a transducer and integrated circuitry similar to the example illustrated in FIGS. 2B and 2C.

Figure 4:
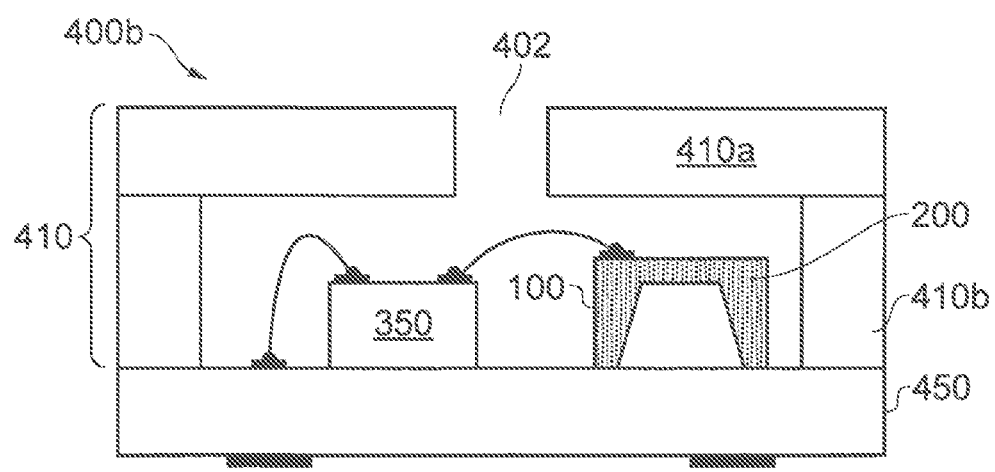
FIG. 4 illustrates another type of transducer package.

FIG. 4 illustrates another type of previously proposed transducer package 400b. In this example the package houses a transducer chip 100 comprising a transducer 200 and a discrete integrated circuit (IC) 350. Thus, in this example, the transducer 100 and IC 350 are co-packaged. The IC 350 is electrically connected to the transducer 200 and is also electrically bonded to the package substrate 450. The IC 350 is bonded to the transducer and package substrate via wire-bonds. A cover 410 is located on the package substrate 450 so as to enclose the transducer 200 and the IC 350. In this package the cover 410 comprises an upper part or lid portion 410a and a side wall 410b which are all typically formed of PCB, i.e. FR4. In this example the transducer is a microphone transducer and the cover 410 has a sound port 402 in the upper part 410a which allows acoustic signals to enter the package.

It will be appreciated that according to the above examples the transducer die and/or the circuitry die are discrete components that are mounted on the first, upper surface of the package substrate. The placement of the chip, typically by an automated "pick-and-place" cycle, requires a high degree of accuracy and repeatability which can be difficult to achieve.

FIGS. 5A-5C illustrate a first example. Specifically FIG. 5A illustrates a plan view of a semiconductor wafer 50 according to a first example. The semiconductor wafer 50 comprises a plurality of wafer portions and at least some of the wafer portions can be considered to define a primary die. Each primary die 500 comprises a hole or aperture 501 in the wafer material which extends all the way through the wafer portion from an upper surface of the wafer substrate to a lower surface of the wafer substrate. The hole can be considered to be region where the semiconductor material of the wafer has been removed or is absent. Furthermore, the hole or aperture can be considered to connect a region directly above the upper surface of the respective wafer portion to a region directly below the lower surface of the wafer portion. Thus, the aperture can be considered to expose an opening in both the upper and lower surfaces of the semiconductor wafer portion. It should be noted that the hole or aperture has an unimpeded path to light, fluids etc., after the wafers semiconducting process steps have been completed. The plurality of holes may be formed as part of a wafer level processing step such as etching. The structure shown in FIG. 5A can be considered to be a semiconductor wafer lattice.

Following dicing of the semiconductor wafer, and as illustrated in FIG. 5B, a plurality of the wafer portions will each define a discrete, or monolithic, primary die 500. It will be appreciated that the step of dicing the wafer may take place when the wafer is in the state illustrated in FIG. 5A. Alternatively, dicing of the wafer may take place following the completion of one or more, further "wafer level" processing stages—i.e. processing stages that are performed on the wafer as a whole and before the wafer is diced. Additional wafer-level processing stages may, for example, include providing and securing one or more secondary dies within the apertures 501, the deposition of one or more layers such as redistribution layers to the upper and/or lower surface of the wafer or a wafer level packaging process for covering the plurality of the wafer portions. Thus, it will be appreciated that processes according to one or more examples of the present aspects may generate a plurality of intermediate products.

FIG. 5C provides an illustrative cross-sectional view of the discrete primary die 500 taken along the line A-A' of FIG. 5B. The primary die 500 can be considered to be a primary substrate or blank die substrate (BDS) and may form a substrate e.g. in a package structure. Although not illustrated in FIG. 5, a primary die 500 may be provided with one or more through silicon vias (TSV) and associated bond pads that are created as part of the wafer-level processing. As is understood in the art a TSV is a vertical electrical connection that passes completely through the silicon die and may be used, in conjunction with an associated bond pad, as an electrical interconnect to the next level of interconnect. Thus, in arrangements where the primary die acts as a substrate e.g. a transducer package substrate, the TSV and associated bond pad beneficially facilitates an electrical connection to be formed through the plane of the substrate. As illustrated in FIG. 5C each hole or aperture 501 defines a region absent of wafer material formed within the die between a first, upper plane X and a second, lower plane Y. The upper plane X is defined by (i.e. is coincident with) the first, upper surface of the primary die (or wafer substrate) whilst the lower plane Y is defined by (i.e. coincident with) the second, lower surface of the primary die (or wafer substrate).

According to the present example, the holes or apertures 501 that are provided in the wafer material are suitable for receiving a discrete die or IC. Thus, the hole is sufficiently sized to at least partially accommodate a discrete substrate portion. According to the present example the wafer portion which defines a die 500 can be considered to be a primary or parent die, whilst the discrete die that is intended to be received within the hole 501 can be considered to be a secondary or child die. A secondary die may also be considered to be a secondary substrate. In the present example the hole is rectangular in shape and is defined by a length x, a width y and a depth z. However, it will be appreciated that the hole may be any other shape, including but not limited to: circular; hexagonal; square; rectangular; "L" shaped; or "C" shaped, provided that it is suitable for receiving a secondary semiconductor die. In particular, the hole may be sufficiently sized to accommodate the planar dimensions— i.e. the x (width) and y (length) dimensions—of the intended secondary die. Preferably, the planar dimensions of the hole are slightly larger than the planar dimensions of the intended secondary die. Thus, the secondary die fits within the aperture when oriented such that the plane of the secondary die is substantially aligned with or parallel to the plane of the wafer.

According to one or more of the present examples, each wafer portion or semiconducting primary die may comprise a plurality of apertures, each aperture extending through the wafer portion or substrate die from an upper surface thereof to a lower surface thereof. Each aperture is suitable for receiving at least one secondary die. FIGS. 12A to 12F show various different substrate structures comprising one or more non-limiting example apertures. Specifically, FIGS. 12A and 12B show a primary die portion forming a substrate and comprising a single hole H1. FIGS. 12C and 12D show a primary die portion forming a substrate and comprising a first hole H1 and a second hole H2. FIG. 12E shows a square-shaped primary die portion comprising four holes H1-H4. FIG. 12F also shows a square-shaped primary die portion and an arrangement of three holes H1-H3. It will be appreciated that a primary or BDS according to the present examples offers a versatile structure for supporting a plurality and/or range of mechanical, electrical and/or electromechanical components, devices and/or systems including for example, ICs and/or MEMS transducers. In particular, it is envisaged that according to one or more of the present examples a single primary die or BDS may be provided with at least two different types of mechanical, electrical and/or electromechanical components, thus facilitating the integration of a various different components of a system within the substrate of a single, i.e. monolithic, die. This offers the potential for considerable space savings and package manufacturing processing steps, cost of packaging, etc.

FIG. 6 shows an expanded view of part of a wafer comprising a row of wafer portions, each of the wafer portions defining a primary die 500. FIG. 6A shows the row of wafer portions in plan view whilst FIG. 6B provides a cross-sectional view. A secondary or "child" die 550 is provided in each of the apertures 501 formed in the wafer portions 500. In this example each of the secondary die are supported within the respective aperture by means of a filler, or support, material 520. The adhesive or bonding material 520 is introduced into the space between the primary and secondary die by overmoulding, as will be understood by those skilled in the art.

The secondary die may be e.g. a transducer die or a circuitry die. It will be appreciated that the secondary die provided within the apertures of at least one row of wafer portions or within the apertures of the whole wafer may all share the same function and may themselves have been fabricated as part of a batch e.g. wafer-level, fabrication process. Thus, the wafer may be considered to be homogeneous in terms of the type, functionality or class of secondary chips that are provided within the apertures of the wafer or wafer row. Alternatively, the one or more of the secondary dies may be different to one or more other secondary die, either in the same row or in a different row, in terms of the function of the secondary dies. Thus, the wafer may be considered to be heterogeneous in terms of the type of class of secondary chips that are provided within the apertures of the wafer or wafer row. According to a particular example one or more of the apertures are provided with a discrete MEMS transducer die, such as a MEMS microphone transducer die. According to a further particular example one or more of the apertures are provided with a discrete circuitry die, such as an IC.

During non-semiconductor processing of the wafer, including during placement of the secondary die 550 within the apertures 501 of the plurality of wafer portions 500, the wafer may be supported on a carrier 530 as is known in the art. Thus, the plurality of secondary die may be placed within the apertures so as to leave a lateral gap or clearance between the outer perimeter surface of the secondary die and the surface of the wafer material which defines the boundary shape of the respective aperture 501. Thus, the secondary die is beneficially supported whilst a fluid filler or support material 520, such as epoxy resin for example, may be supplied so as to fill the lateral gap. The carrier, usually in the form of a sheet, may be removed at a later stage once the filler material has hardened or set, and the secondary die is thus secured or fixedly supported within the aperture.

FIG. 6C illustrates the singulated wafer portion 500 which can be considered to be a primary or parent die. The primary die 500 comprises a secondary or child die supported (e.g. embedded or encapsulated) within an aperture 501. The aperture 501 can be considered to be a region of absence of the semiconductor wafer material. Thus, even though as illustrated in FIG. 6C the aperture or hole has been filled with the secondary die and filler material, there is nonetheless a region 501 where the wafer material is absent. As illustrated in FIG. 6C a discrete secondary die can be considered to be integrated within the silicon substrate, or primary die, defined by the wafer portion 500. In particular, the secondary die is integrated within the plane of the primary die. The primary die may be provided with TSV's and associated bond pads (not shown).

It will be appreciated that further non-semiconductor wafer level processing may take place before dicing of the wafer takes place, e.g. in order to provide one or more redistribution layers for one or more electrical connections between the primary and secondary. Such redistributions layers being applied to the whole wafer in a batch process as will be understood by those of ordinary skill in the art.

In a further example each wafer portion comprises two more holes or apertures, each aperture being suitable for receiving a discrete secondary die. Thus, each of the holes is sufficiently sized to receiving another discrete die portion. The discrete die may be supported within a given aperture of the wafer portion by means of a filler material. Thus, the apertures may be sufficiently sized such that the planar dimensions of a given aperture or hole are larger than the planar dimensions of the intended chip. According to a particular example of the present embodiments, a first hole of a given primary die may comprise a transducer die, such as a MEMS microphone transducer die, whilst the second hole of the said primary die may comprise a circuitry die, such as an IC for receiving output signals from the transducer chip. Thus, the primary die comprises two embedded secondary die which can be considered to be integrated within the same primary die substrate. Electrical connections may be advantageously formed between the embedded secondary die using one or more metal layers or redistribution layers and/or at least one TSV.

FIG. 7 illustrates various views of a semiconductor wafer, and corresponding primary die, comprising a MEMS transducer and an aperture.

Thus, FIG. 7A illustrates a plan view of a semiconductor wafer 70 comprising a plurality of wafer portions according to a second example at least some of the wafer portions defining a primary die 700. Each primary die 700 has been processed in a first transducer region T of the primary die to provide a MEMS transducer 702. In this particular example the MEMS transducer comprises a MEMS microphone transducer. However, it will be appreciated that other types of transducer, such as an accelerometer, gyroscope etc., may be fabricated and/or provided in a transducer region T of each of the primary die regions. Examples are also envisaged wherein each primary die may be provided with more than one transducer. Furthermore, each primary die 700 has been processed in a second aperture region A of the wafer portion to form a hole or aperture 701 in the wafer material.

As illustrated in FIG. 7B at least some of the wafer portions will define a primary die 700 following dicing of the semiconductor wafer. The resultant structure is therefore a primary die or primary substrate comprising a MEMS transducer formed in a transducer region T of the die and an aperture formed in an aperture region A of the die.

It will be appreciated that the step of dicing the wafer may take place when the wafer is in the state illustrated in FIG. 7A but may also take place following additional wafer level processing stages. Thus, it will be appreciated that multiple intermediate products are formed during intermediate steps of a fabrication process.

FIG. 7C provides a cross-sectional view of the discrete primary die 700 taken along the line A-A' of FIG. 7B. As illustrated in FIG. 7C the hole 701 defines a region absent of the wafer material formed within the substrate 700 between a first, upper plane X and a second, lower plane Y. The upper plane X is defined by (i.e. is coincident with) the first, upper surface of the primary die whilst the lower plane Y is defined by (i.e. coincident with) the second, lower surface of the primary die. The MEMS microphone transducer comprises a flexible membrane 710 which overlies a cavity 708 formed in the lower surface of the wafer portion 700. In contrast to the cavity 708 which underlies the membrane of a MEMS transducer provided in a transducer region of the primary die, the hole or aperture 701 provided in the aperture region of the primary die extends completely through the wafer portion 700 from a first opening in the upper surface of the wafer substrate to a second opening in the lower surface of the wafer substrate. In particular the opening in the upper surface of the primary die that is defined by the aperture allows a secondary die to be located within the aperture via the first opening, from a region directly above the wafer.

The hole 701 in the wafer material is suitable for receiving a discrete die or chip. Thus, the hole is sufficiently sized to at least partially accommodate another discrete die. According to the present example the substrate 700 can be considered to be a primary or parent die, whilst the die that is intended to be received within the hole 701 can be considered to be a secondary or child die. In the present example the hole is rectangular in shape and is defined by a length x, a width y and a depth z. However, it will be appreciated that the hole may be any other shape provided it is suitable for receiving a secondary die. In particular, the hole may be sufficiently sized to accommodate the planar dimensions—i.e. the x and y dimensions—of the secondary die. Preferably, the planar dimensions of the hole are slightly larger than the planar dimensions of the intended secondary die.

One or more of the present examples may be considered to comprise a secondary die which may be a device or circuitry die—located within the aperture of the primary die. Thus, as shown in FIG. 7D, a primary die 700 comprises a semiconductor substrate and a MEMS transducer 702 formed in a transducer region of the substrate. A secondary die 720 is located within the MEMS transducer substrate in the aperture region. Thus, the secondary die comprises a discrete die which is supported between the upper and lower planar surfaces of the substrate. In this sense the secondary die can be considered to be provided within the plane of the primary die. Due to the way in which the secondary die will typically be located within the aperture with the aid of a carrier sheet, the lower planar surface of the secondary die will be substantially flush with (i.e. coincident with) the plane defined by the lower surface of the primary die. The MEMS transducer may be electrically connected to the secondary die 720 by means of wire bonding or, advantageously, through one or more redistribution layers (not shown) applied to the upper and/or lower surface of the primary die.

Figure 13:
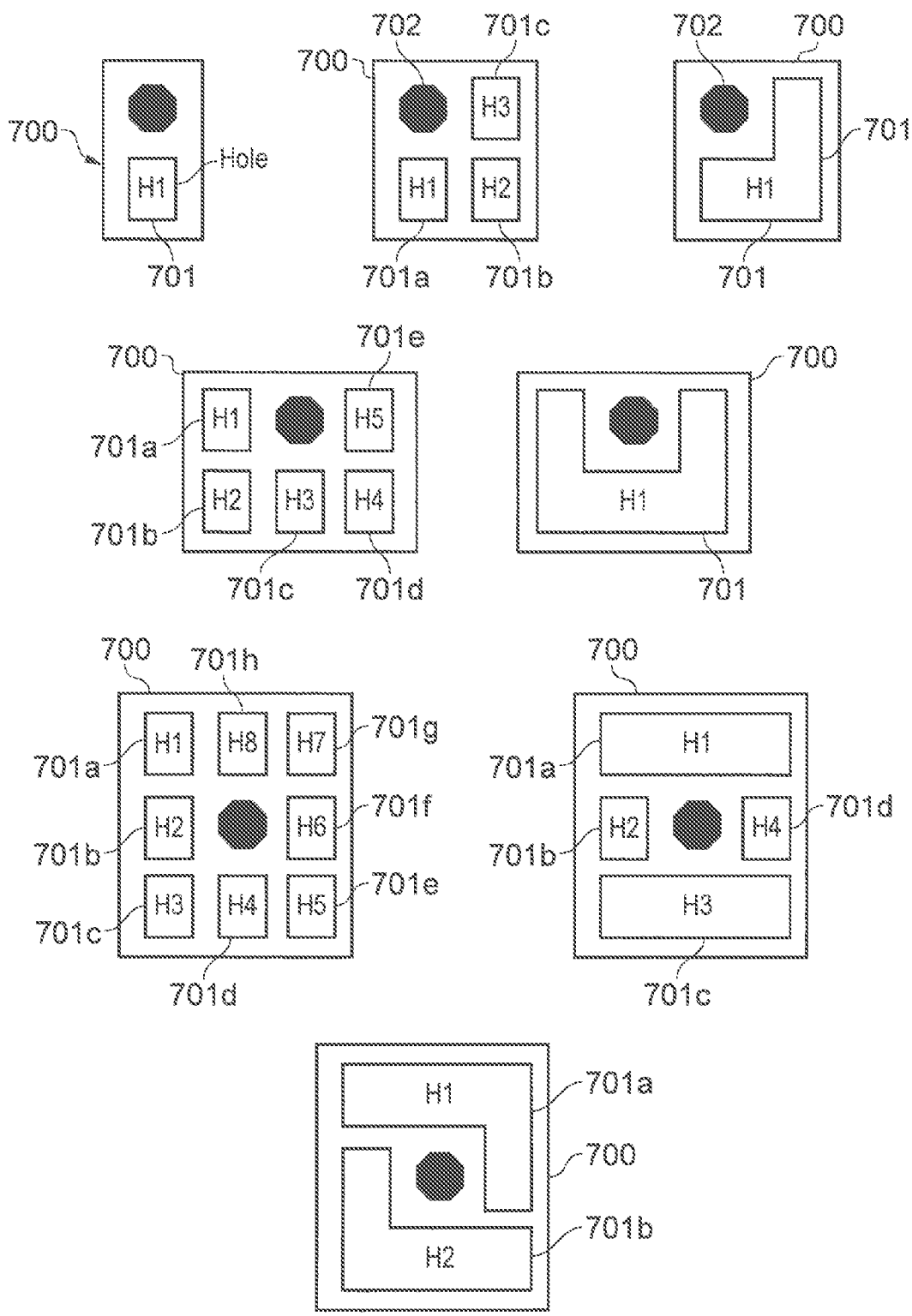

According to one or more of the present examples each wafer portion defining a primary die may comprise a plurality of apertures, each aperture extending through the wafer portion or substrate die from an upper surface thereof to a lower surface thereof. Each aperture is suitable for receiving at least one secondary die. FIG. 13 shows a number of variations or modifications of the primary die illustrated in FIG. 7B. In each of the examples shown in FIG. 13 the die 700, which can be considered to be a primary die, is provided with a single MEMS transducer. The primary die is also provided with one or more holes or apertures 701a . . . h, each aperture being suitable for receiving at least one discrete secondary die or semiconductor die.

A process of fabricating a support structure similar to that shown in FIG. 7D will now be described with reference to FIGS. 8 and 9.

FIG. 8A shows a semiconductor wafer 80. One or more of the wafer portions of the wafer portion defines a primary die 800 and is processed to provide a MEMS microphone transducer 802 and an aperture 801 which extends through the semiconductor material of the wafer portion from an upper surface to a lower surface thereof.

Conveniently, during a previous process the wafer is processed to provide a MEMS microphone transducer structure on each wafer portion. Then, in a subsequent processing stage according to the present examples a transducer cavity (not shown) is formed in the lower surface (back side) of the primary die 800 in a region underlying the MEMS microphone transducer structure 802. The cavity may either allow acoustic pressure waves to be incident on a flexible membrane of the MEMS microphone transducer 802 or provide a back-volume for the transducer 802. Advantageously, according to the present examples, the process of forming at least a portion of the aperture 801 may take place at the same time as forming the transducer cavity e.g. by an etching process. It will be appreciated, however, that since the transducer cavity does not extend all the way through the die, the start time of the etching process to form the aperture may be in advance of the start time of the etching process to form the cavity.

FIG. 8B illustrates another wafer 85. The wafer 85 comprises a plurality of wafer portions one or more of which define a circuitry die region. The wafer 85 is diced to form a plurality of circuitry die 850. Each circuitry die may be, e.g. an IC for processing the output of the transducer device 802.

FIGS. 9A to 9D illustrate a series of stages in a wafer level processing flow for processing of the wafer 80 shown in FIG. 8A. Each of FIGS. 9A to 9E illustrates a top plan view and a cross-sectional view of a part of the wafer 80'.

Figure 9A:
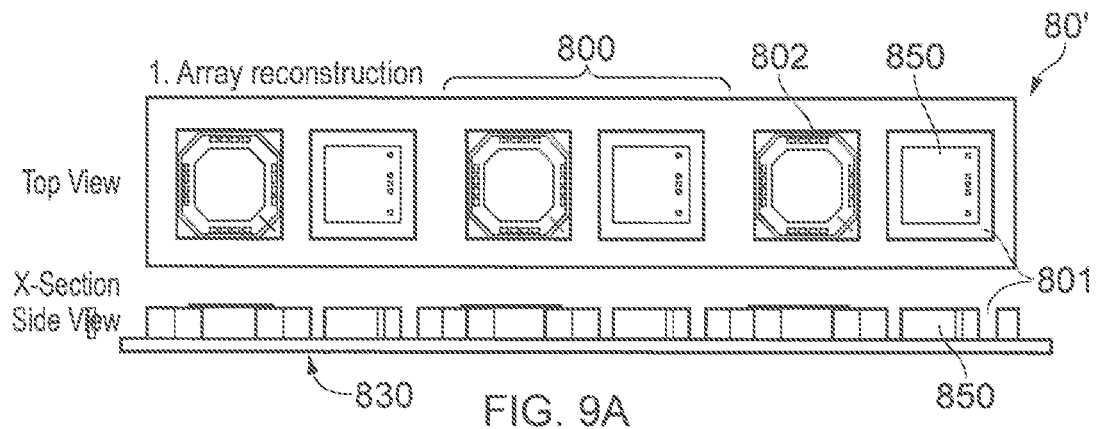
Figure 9B:
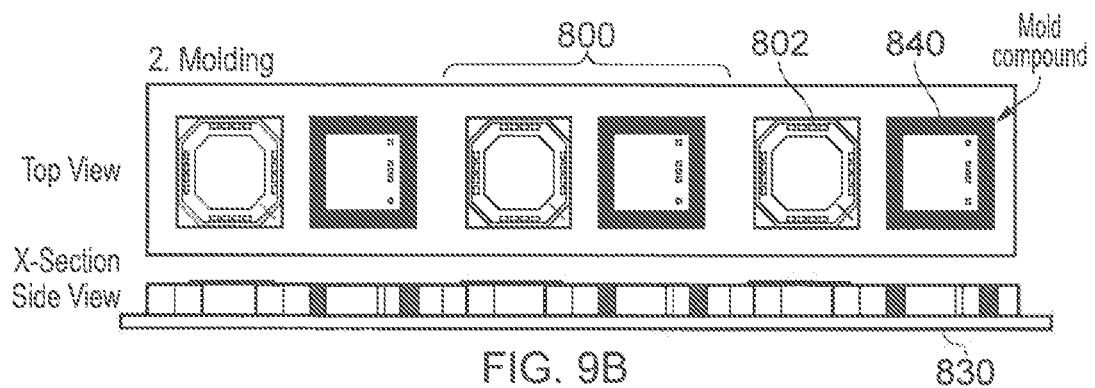
Figure 9C:
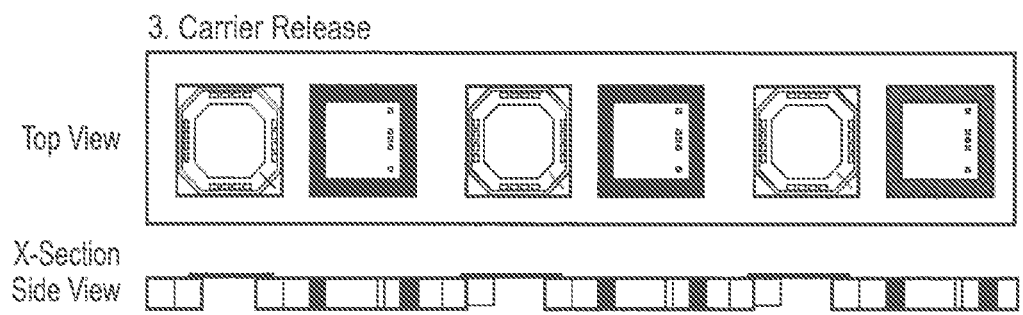

In FIG. 9A the wafer is provided on a carrier layer 830 which serves to support the wafer in the region of the aperture 801 whilst a secondary die 850—which comprises an IC as illustrated in FIG. 8B—is positioned within the aperture. As shown in FIG. 8A the planar dimensions of the secondary die 850 are smaller than the planar dimensions of the aperture 801 and a gap or clearance exists between the perimeter of the secondary die 850 and the side walls of the aperture 801. As shown in FIG. 9B, a moulding step involves supplying e.g. injecting, a moulding material 840 such as an epoxy mould material. Once the moulding material has set, thereby securing the secondary die 850 within the aperture, the carrier layer 830 is removed as shown in FIG. 9C. The resultant structure shown in FIG. 9C can be considered to be a composite or hybrid structure comprising a planar frame or lattice of semiconductor wafer material and a plurality of discrete secondary die at least partially buried or encapsulated within the plane of the wafer. According to the illustrated example the lower planar surfaces of the discrete secondary die are flush with the lower planar surface of the wafer.

Figure 9D:
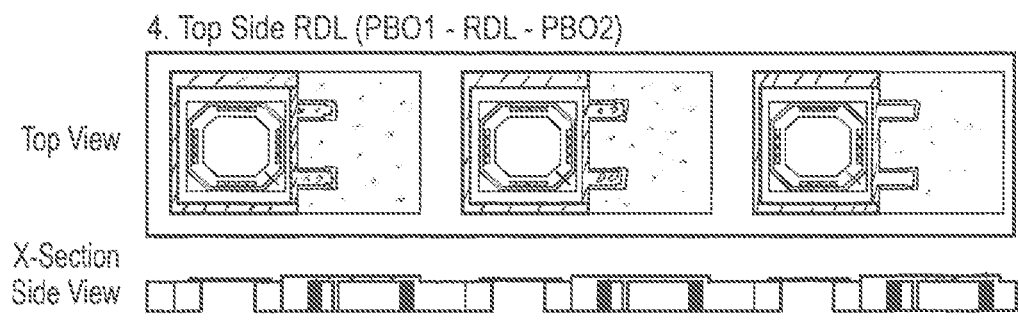

FIG. 9D illustrates a process of applying a redistribution layer by a RDL process. A RDL or redistribution process typically involves providing a metal, e.g. copper, plating on the top surface of the processed wafer in order to redistribute or relocate electrical connections as will be understood by those of ordinary skill in the art. For the purposes of illustration, the RDL process will typically involve:

applying a first layer of insulator, e.g. a dielectric material, that will leave exposed only the bond pad interface on the respective die;

applying a copper patterning which will ensure appropriate electrical connection between the respective bond pad interfaces that will be used for soldering (such as I/O pads and lid track in case of use of metal lid); and applying a second dielectric which will protect the copper surface of the electrical connection from oxidation.

FIG. 10 illustrates a semiconductor wafer, and corresponding substrate die, comprising circuitry and an aperture.

Thus, FIG. 10A illustrates a plan view of a semiconductor wafer 90 according to a further example. The wafer 90 comprises a plurality of wafer portions 900 according to a further example. Each wafer portion 900 has been processed in a circuitry region C of the wafer portion to provide electronic circuitry. Furthermore, each wafer portion 900 has been processed in an aperture region A of the wafer portion to form a hole or aperture 901 through the wafer material. The hole or aperture 901 extends through the wafer portion 900 from an opening in the upper surface of the wafer substrate to an opening in the lower surface of the wafer substrate.

As illustrated in FIG. 10B each wafer portion will define a discrete substrate 900 following dicing of the semiconductor wafer. The resultant structure is therefore a substrate portion or substrate die comprising circuitry provided in the circuitry region C of the die and an aperture formed in an aperture region A of the die.

Figure 14:
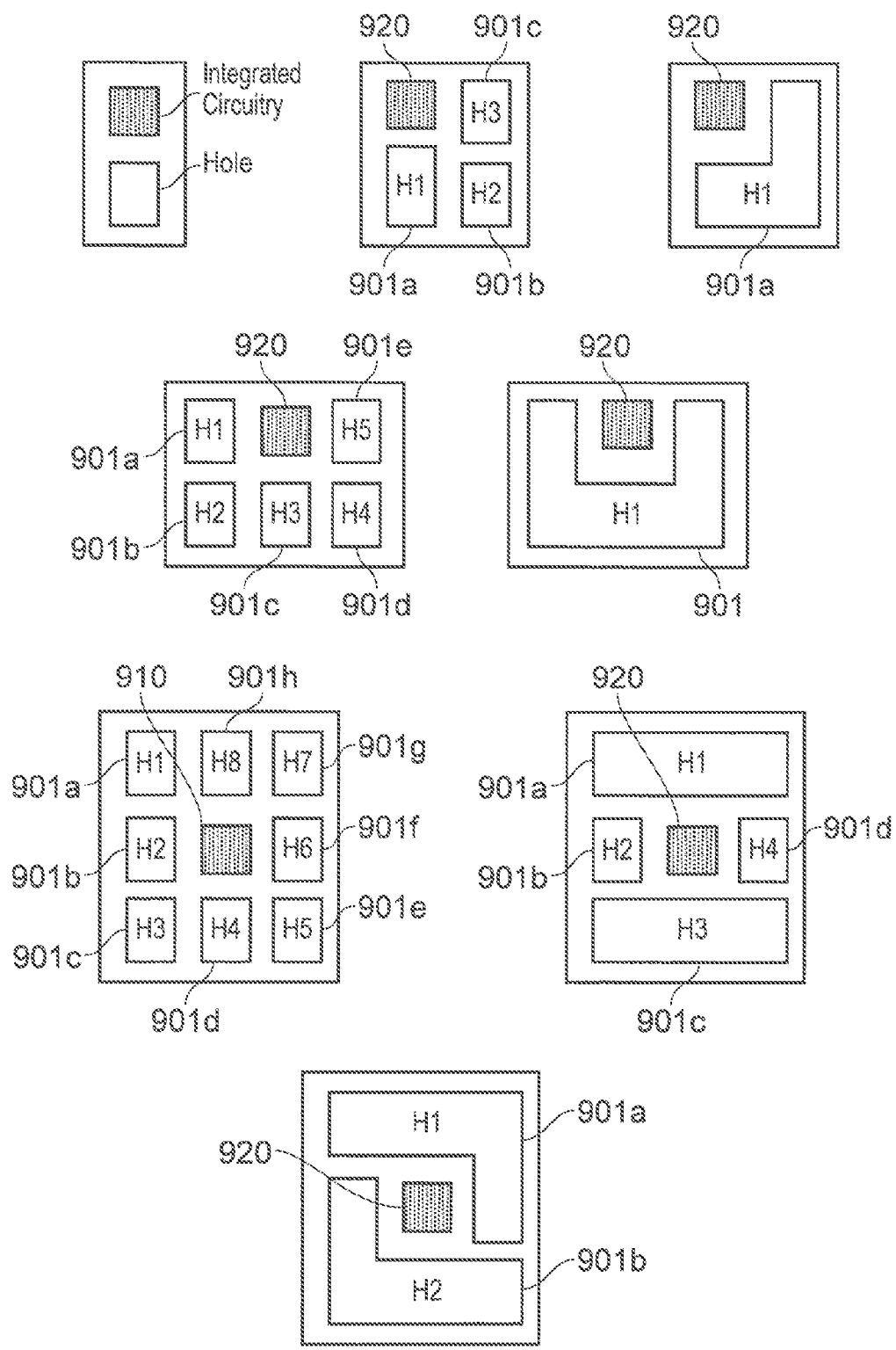

FIG. 14 shows a number of different substrate dies according to variations of the substrate die illustrated in FIG. 10B. In each of the examples shown in FIG. 14 the die 900, which can be considered to be a primary die, is provided with a circuitry region comprising electronic circuitry 920. The primary die is also provided with one or more holes or apertures 901a . . . h, each aperture being suitable for receiving at least one discrete secondary die.

FIG. 11 illustrates a semiconductor wafer, and corresponding primary die, comprising a MEMS transducer, circuitry and an aperture.

Thus, FIG. 11A illustrates a plan view of a semiconductor wafer 60 comprising a plurality of wafer portions 600 according to a further example. Each wafer portion 600 has been processed in a circuitry region C of the wafer portion, i.e. die, to provide integrated electronic circuitry. Each wafer portion 600 has also been processed in a transducer region T of the wafer portion to provide a MEMS transducer 602. However, it will be appreciated that other types of transducer or device may be fabricated and/or provided in a transducer region T of each of the wafer portions. Furthermore, each wafer portion 600 has been processed in an aperture region A of the wafer portion to form a hole or aperture 601 in the wafer material. The hole or aperture 601 extends through the wafer portion 900 from an opening in the upper surface of the wafer substrate to an opening in the lower surface of the wafer substrate.

As illustrated in FIG. 11B each wafer portion will define a discrete substrate 600 following dicing of the semiconductor wafer.

Figure 15:
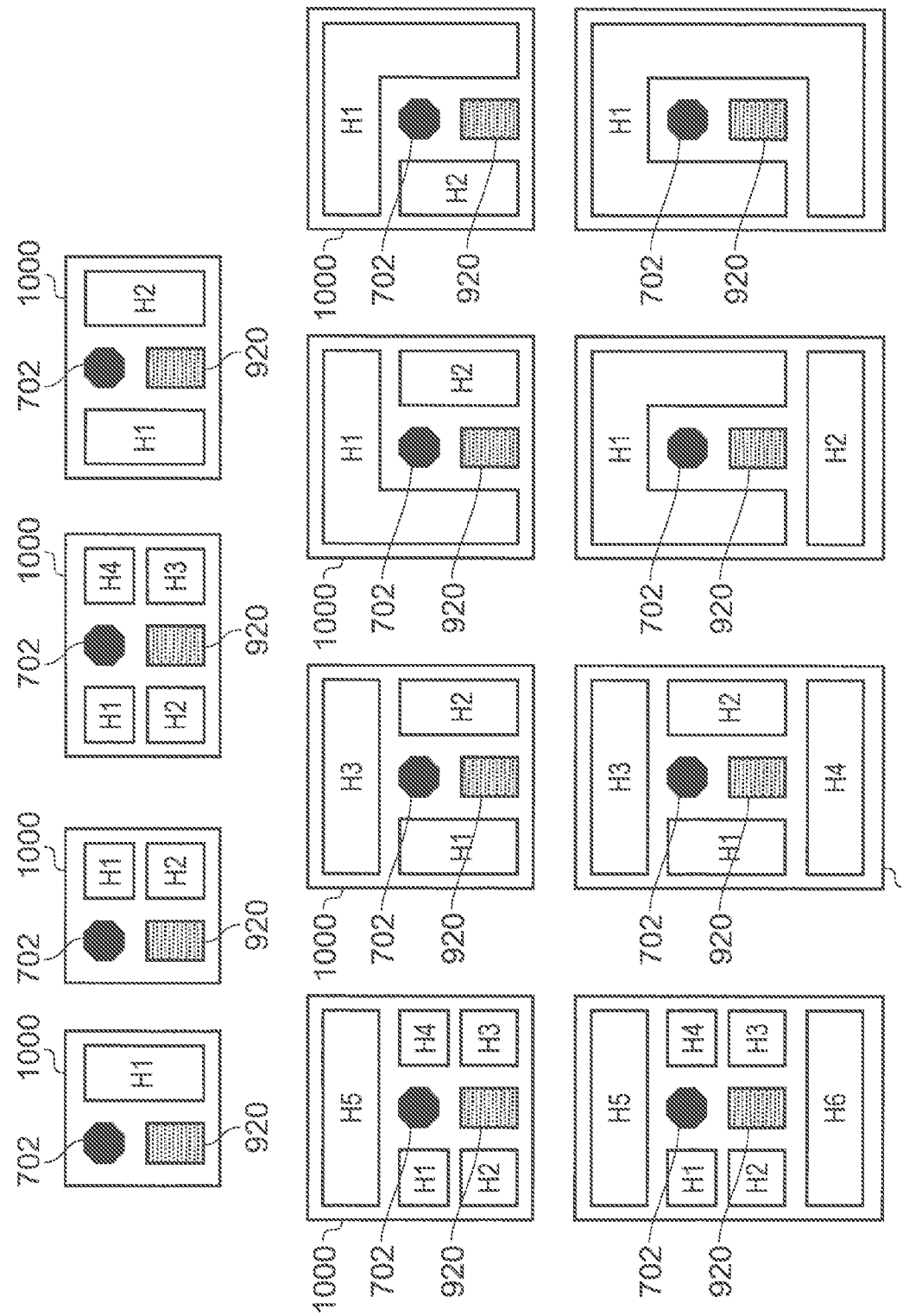

FIG. 15 shows a number of different substrate dies according to variations of the substrate die illustrated in FIG. 11B. In each of the examples shown in FIG. 15 the die 1000, which can be considered to be a primary die, is provided with a single circuitry region and a single transducer region 702. The primary die is also provided with one or more holes or apertures H1 . . . H6 each aperture being suitable for receiving at least one discrete secondary substrate die.

According to one or more of the present examples, the die or wafer portion of a wafer is provided with a MEMS microphone transducer which can be considered to be an input transducer. Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of an output transducer, such as MEMS speakers for example, the membrane is moved by electrostatic forces generated by varying a potential difference applied across the electrodes.

A singulated primary die according to an example of the present aspects will preferably be housed within a package which allows easy handling and assembly and serves to protect the primary die and the components supported thereby—e.g. secondary die—from e.g. mechanical damage, RF noise and environmental contamination. The package also provides a means—e.g. an external conductive contact—for connecting the package to a circuit board or other elements. The creation of a package for an electronic system involves numerous processing steps and stages. In conventional packaging techniques, the finished wafer is diced into individual chips which are then bonded to a packaging substrate and encapsulated. Wafer-level packaging involves packaging the chips whilst they are still part of the wafer and prior to dicing into individual packages.

FIG. 16 shows a cap wafer 1100 comprising a plurality of cap wafer portions 1010. At least some of the cap wafer portions 1010 is processed to comprise a recessed area 1020. The recessed area may optionally be plated with a metal material in order to act as a barrier to RF noise and interference. The wafer can be considered to be a cap wafer since each of the cap wafer portions defines a cap portion (or lid) for a respective wafer portion of a primary die wafer. Thus, according to a process of the present aspects, a cap wafer as illustrated in FIG. 16 may be arranged relative to a semiconductor wafer according to an example of the present aspects in order to define a package. Thus, the recessed area of a given cap wafer portion defines side walls which are mounted to the upper surface of a primary substrate wafer portion in a process known as wafer to wafer bonding. Thus, the cap portion in conjunction with the primary die defines a package chamber. Advantageously, according to one or more of the present examples, the primary die forms the package substrate, with the lid structure being mounted on the primary die and thus obviating the need for a separate package substrate. Thus, a package incorporating a primary die according to one or more of the present examples which acts as the package substrate beneficially achieves a reduction in overall package height.

A package which houses a microphone transducer will typically have a sound port to allow transmission of sound waves to/from the transducer within the package and the transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one or more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

According to at least one example, wherein the primary die comprises a MEMS microphone transducer and wherein the cavity of the MEMS microphone transducer is formed in the underside of the primary die, the cavity may also be considered to form the sound port of the package.

FIG. 17 shows a transducer package comprising a primary die 700 which is similar to the primary die illustrated in FIG. 7D. Thus, the primary die comprises a MEMS transducer 702 formed in a transducer region of the substrate. A secondary die 720 is embedded within an aperture of the primary die (which forms the MEMS transducer substrate), the aperture being defined between the upper and lower planar surfaces of the primary die. The primary die further comprises a plurality of TSVs 703 which extend through the plane of the substrate from an internal bond pad 704 to an external bond pad 705. An RDL layer 706 is provided on the upper surface of the primary die. A cap portion 1010 is mounted on an upper surface of the primary die to define the back volume of the MEMS microphone transducer 702.

In any of the above examples, it will be appreciated that whilst the planar dimensions (x- and y-dimensions) of the apertures must be sufficient to accommodate the planar dimensions of the intended secondary die, the secondary die may exhibit a depth that is less than, equal to, or greater than the depth (z-dimension) of the aperture. Thus, whilst there may be a benefit in being able to fully accommodate the intended secondary die within the cavity defined by the aperture of a given wafer portion, so that the secondary die does not protrude above the upper or lower surface of the primary die, this is not essential. Indeed, reducing or minimising the amount by which a secondary protrudes above the surface of the primary die may be particularly advantageous in examples where a chamber is to be defined—e.g. by means of a package lid structure or the like—in the region directly above the upper surface of the primary die and where the volume of that chamber has an impact on the performance of the packaged device. For example, in the case of a primary die which comprises a MEMS microphone transducer having a flexible membrane formed relative to an upper surface of the primary die and overlying a cavity provided from the lower surface of the primary die, the chamber will form the back volume of the microphone transducer. Thus, according to one or more of the present examples, it is possible to embed an ASIC within an aperture of the primary die—in other words within the same substrate that forms the cavity of the transducer—and to achieve a gain in headroom inside the chamber and/or a reduction in package height in comparison to previously proposed microphone transducers.

It is envisaged within the context of the present examples and aspects that the aperture of the primary die may be provided with a secondary die that is fabricated according to a process node or technology scale that is different to the process node of the primary die. For example, the semiconductor wafer may be fabricated according to a 55 nm technology node process for example, whilst the secondary chip may have been fabricated by a 80 nm, 22 nm or even 7 nm technology processing node.

It should be understood that the term "semiconductor material" as used herein include, but is not limited to, any and all: Group IV elemental/compound semiconductors; Group VI elemental semiconductors; Group III-V, II-VI, I-VII, IV-VI, V-VI, II-V, I-III-VI$_2$ semiconductors; oxides; layered, magnetic and/or organic semiconductors.

Whilst examples of the present aspects are particularly applicable to structures for supporting MEMS sensor transducers, especially capacitive transducers such as MEMS microphones. It will also be appreciated that other types of MEMS capacitive sensors could be implemented, for example accelerometers, pressure sensors, proximity sensors or flow meters.

Examples of the present aspects may be implemented in a host device, especially a portable and/or battery powered host device such as a mobile telephone, an audio player, a video player, a PDA, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole jacks, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The present application includes the following statements:

Statement 1A. A semiconductor wafer comprising a plurality of wafer portions, each wafer portion defining a primary substrate and comprising at least one aperture extending through the semiconductor wafer from an upper surface of the semiconductor wafer to a lower surface of the semiconductor wafer, wherein the aperture is suitable for receiving a secondary substrate.

Statement 1B. A semiconductor wafer comprising a plurality die, at least one die comprising an aperture extending through the die between upper and lower surfaces of the die, wherein the aperture is suitable for receiving a semiconductor die.

Statement 1Ba. A semiconductor wafer comprising a plurality of first die, at least one first die comprising an aperture extending through the die between upper and lower surfaces of the die, wherein the aperture is suitable for receiving a semiconductor second die.

Statement 1C. A semiconductor wafer comprising a plurality die, wherein a subset plurality of die each comprise an aperture extending through the die between upper and lower surfaces of the die, wherein the aperture is suitable for receiving a semiconductor die.

Statement 1D. A semiconductor wafer comprising a plurality die, each die comprising an aperture extending through the die between upper and lower surfaces of the die, wherein the aperture is suitable for receiving a semiconductor die.

Statement 2A. A first semiconductor die comprising an aperture extending between its upper and lower surfaces, wherein the aperture is suitable for receiving a second semiconductor die.

Statement 3A. A semiconductor wafer comprising a plurality die, at least one die comprising a MEMS transducer in a transducer region and an aperture extending through the die between upper and lower surfaces of the die in an aperture region, wherein the aperture is suitable for receiving a semiconductor die.

Statement 3B. A semiconductor wafer comprising a plurality of first die, at least one first die comprising a MEMS transducer in a transducer region and an aperture extending through the at least one first die between upper and lower surfaces of the at least one first die in an aperture region, wherein the aperture is suitable for receiving a semiconductor second die.

Statement 4A. A first semiconductor die comprising a MEMS transducer in a transducer region and an aperture extending between its upper and lower surfaces in an aperture region, wherein the aperture is suitable for receiving a second semiconductor die.

Statement 5A. A semiconductor wafer comprising a plurality die, at least one die comprising electronic circuitry in a circuit region and an aperture extending through the die between upper and lower surfaces of the die in an aperture region, wherein the aperture is suitable for receiving a semiconductor die.

Statement 5B. A semiconductor wafer comprising a plurality of first die, at least one first die comprising electronic circuitry in a circuit region and an aperture extending through the at least one first die between upper and lower surfaces of the at least one first die in an aperture region, wherein the aperture is suitable for receiving a semiconductor second die.

Statement 6A. A first semiconductor die comprising electronic circuitry in a circuit region and an aperture extending between its upper and lower surfaces in an aperture region, wherein the aperture is suitable for receiving a second semiconductor die.

Statement 7A. A semiconductor wafer comprising a plurality die, at least one die comprising a MEMS transducer in a transducer region, electronic circuitry in a circuit region and an aperture extending through the die between upper and lower surfaces of the die in an aperture region, wherein the aperture is suitable for receiving a semiconductor die.

Statement 8. A first semiconductor die comprising a MEMS transducer in a transducer region, electronic circuitry in a circuit region and an aperture extending between its upper and lower surfaces in an aperture region, wherein the aperture is suitable for receiving a second semiconductor die.

The invention claimed is:

1. A semiconductor wafer comprising a plurality of primary die portions, each primary die portion configured to define a primary die following dicing of the semiconductor wafer, wherein at least one primary die portion comprises a plurality of apertures, each aperture extending through the semiconductor wafer from an upper surface of the semiconductor wafer to a lower surface of the semiconductor wafer, wherein each aperture is suitable for receiving a respective secondary die.

2. A semiconductor wafer as claimed in claim 1, the at least one primary die portion further comprising a secondary die provided within one of the plurality of apertures.

3. A semiconductor wafer as claimed in claim 2, wherein a first secondary die is provided in one of the plurality of apertures and wherein a second secondary die is provided in another of the plurality of apertures.

4. A semiconductor wafer as claimed in claim 1, wherein the secondary die comprises one or more of: a transducer die or a circuitry die.

5. A semiconductor wafer as claimed in claim 3, wherein the first secondary die comprises a transducer die and the second secondary die comprises a circuitry die.

6. A semiconductor wafer as claimed in claim 2, wherein the secondary die is supported within the aperture by a moulding material, wherein the moulding material is provided between the outer perimeter of the secondary die and the side walls of the aperture.

7. A semiconductor wafer as claimed in claim 6, wherein the moulding material defines a rigid connecting frame.

8. A semiconductor wafer as claimed in claim 1, wherein the at least one primary die portion further comprises:
a MEMS transducer provided in a transducer region of the primary die portion, wherein the semiconductor wafer material of the primary die portion forms a substrate of the MEMS transducer.

9. A semiconductor wafer as claimed in claim 8, wherein the MEMS transducer is a MEMS microphone transducer, wherein the MEMS microphone transducer comprises a flexible membrane which overlies a cavity formed in the lower surface of the primary die portion.

10. A semiconductor wafer as claimed in claim 1, wherein the at least one primary die portion further comprises:
   a circuitry region, the circuitry region comprising at least one circuitry component in the circuitry region.

11. A primary die comprising a plurality of apertures each extending through the primary die from an upper surface of the primary die to a lower surface of the primary die, wherein each aperture is suitable for receiving a respective secondary die, wherein a first secondary die is provided within one of the plurality of apertures and wherein a second secondary die is provided within another of the plurality of apertures.

12. A primary die as claimed in claim 11, further comprising a MEMS transducer provided in a transducer region of the primary die.

13. A primary die as claimed in claim 11, further comprising circuitry provided in a circuitry region of the primary die.

14. A primary die as claimed in claim 11, further comprising at least one conductive layer provided on the upper and/or lower surface thereof for redistributing an electrical contact to a different location on the primary die.

15. A primary die as claimed in claim 11, further comprising a secondary die provided within one of the plurality of apertures.

16. A primary die as claimed in claim 15, wherein the secondary die comprises one or more of: a transducer die or a circuitry die.

17. A primary die as claimed in claim 15, wherein the first secondary die comprises a transducer die and the second secondary die comprises a circuitry die.

18. A primary die as claimed in claim 15, wherein the secondary die comprises one or more electrical contact, the primary die further comprising at least one conductive layer provided on the upper and/or lower surface thereof for redistributing the electrical contact to a different location on the primary die.

19. A primary die as claimed in claim 15, wherein the secondary die is supported within the aperture by a connecting frame formed between the outer perimeter of the secondary die and the side walls of the aperture.

20. A wafer package comprising first and second wafers, the first wafer comprising the semiconductor wafer as claimed in claim 1 and the second wafer comprising a cap wafer, the cap wafer defining at least one cap structure, each cap structure being provided for a corresponding primary die of the semiconductor wafer.

21. A package comprising:
   a primary die as claimed in claim 11; and
   a lid structure provided so as to define a cover portion which extends in a plane overlying the upper surface of the primary die.

22. A semiconductor wafer as claimed in claim 1, comprising at least one of:
   a bond pad;
   a through silicon via extending through a plane of the semiconductor wafer; and
   a conductive redistribution layer provided on the upper surface of the semiconductor wafer.

23. A primary die as claimed in claim 11, comprising at least one of:
   a bond pad;
   a through silicon via extending through a plane of the primary die; and
   a conductive redistribution layer provided on the upper surface of the primary die.

24. A package comprising a primary die as claimed in claim 11, the package further comprising:
   a plurality of internal bond pads and a plurality of external bond pads;
   a plurality of through silicon vias extending through a plane of a substrate of the primary die, each through silicon via extending from one of the internal bond pads to one of the external bond pads such that each internal bond pad is connected to one of the external bond pads by one of the through silicon vias;
   a conductive redistribution layer provided on the upper surface of the primary die; and
   a cap portion mounted to the upper surface of the primary die.

25. The primary die as claimed in claim 19, wherein a moulding material defines the connecting frame.

26. The wafer package as claimed in claim 20, wherein the cap wafer comprises a semiconductor.

27. The package as claimed in claim 21, wherein the lid structure comprises a semiconductor material.

\* \* \* \* \*